US007902615B2

(12) United States Patent
Schlosser et al.

(10) Patent No.: US 7,902,615 B2
(45) Date of Patent: Mar. 8, 2011

(54) MICROMECHANICAL STRUCTURE FOR RECEIVING AND/OR GENERATING ACOUSTIC SIGNALS, METHOD FOR PRODUCING A MICROMECHANICAL STRUCTURE, AND USE OF A MICROMECHANICAL STRUCTURE

(75) Inventors: Roman Schlosser, Reutlingen (DE); Stefan Weiss, Tuebingen (DE); Frank Fischer, Gomaringen (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/084,477

(22) PCT Filed: Nov. 14, 2006

(86) PCT No.: PCT/EP2006/068419

§ 371 (c)(1), (2), (4) Date: Aug. 24, 2009

(87) PCT Pub. No.: WO2007/062975

PCT Pub. Date: Jun. 7, 2007

(65) Prior Publication Data

US 2010/0002543 A1 Jan. 7, 2010

(30) Foreign Application Priority Data

Nov. 29, 2005 (DE) ......................... 10 2005 056 759

(51) Int. Cl.
*H01L 29/84* (2006.01)
*H04R 19/00* (2006.01)

(52) U.S. Cl. .................. 257/415; 257/E27.114; 361/181

(58) Field of Classification Search .................. 257/415, 257/417, 419, 414, E27.114, E21.054; 438/48, 438/50, 53, 717; 367/181
See application file for complete search history.

(56) References Cited

U.S. PATENT DOCUMENTS 5,146,435 A * 9/1992 Bernstein ...................... 367/181
5,452,268 A 9/1995 Bernstein
2002/0151100 A1 10/2002 Coffa et al.
2003/0133588 A1 7/2003 Pedersen

FOREIGN PATENT DOCUMENTS

EP 0 331 992 9/1989

* cited by examiner

*Primary Examiner* — Thomas L Dickey
*Assistant Examiner* — Nikolay Yushin
(74) *Attorney, Agent, or Firm* — Kenyon & Kenyon LLP

(57) ABSTRACT

A micromechanical structure and a method for producing a micromechanical structure are provided, the micromechanical structure being configured for receiving and/or generating acoustic signals in a medium at least partially surrounding the structure. The structure includes a first counterelement that has first openings and essentially forms a first side of the structure, a second counterelement that has second openings and essentially forms a second side of the structure, and an essentially closed diaphragm disposed between the first counterelement and the second counterelement.

20 Claims, 2 Drawing Sheets

Figure 1:
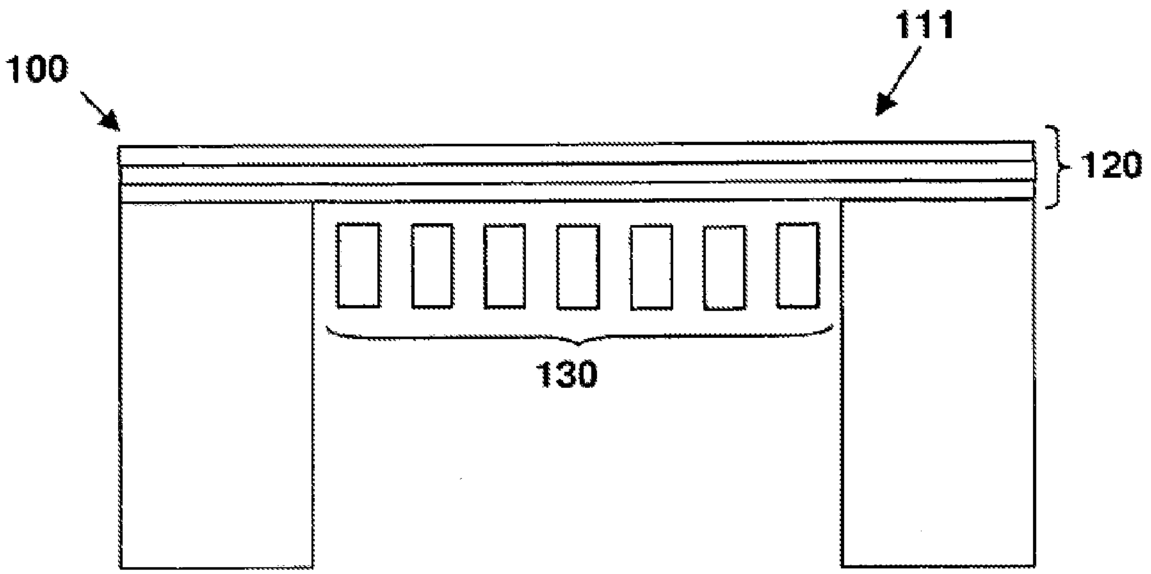
Figure 1 PRIOR ART

MICROMECHANICAL STRUCTURE FOR RECEIVING AND/OR GENERATING ACOUSTIC SIGNALS, METHOD FOR PRODUCING A MICROMECHANICAL STRUCTURE, AND USE OF A MICROMECHANICAL STRUCTURE

BACKGROUND OF THE INVENTION

1. Field of the Invention

The present invention relates to a micromechanical structure for receiving and/or generating acoustic signals in a medium at least partially surrounding the structure.

2. Description of Related Art

U.S. Patent Application 2002/0151100 A1 discloses a monolithically integrated pressure sensor having a microphone cavity, a backplate being disposed above an acoustic diaphragm located in a middle plane, the diaphragm being disposed above a cavity, the cavity being closed off toward the bottom by a substrate. A disadvantage here is that because of the substrate being closed off toward the bottom, no top- or bottom-side incoupling or outcoupling of acoustic signals is possible. It is additionally disadvantageous that the sensitivity of the assemblage is thereby reduced.

BRIEF SUMMARY OF THE INVENTION

The micromechanical structure according to the present invention for receiving and/or generating acoustic signals in a medium at least partially surrounding the structure, and the method for producing a micromechanical structure and the use of a micromechanical structure according to the present invention have the advantage that with simple means, an improvement in the acoustic properties of the micromechanical structure is possible, and the micromechanical structure is nevertheless producible by way of a comparatively simple and robust production method. The micromechanical structure according to the present invention exhibits great mechanical stability because of the embedding of the diaphragm (buried diaphragm) between the first and the second counterelement.

It is particularly preferred that a first cavity be configured between the first counterelement and the diaphragm and that a second cavity be configured between the diaphragm and the second counterelement, and that the first counterelement have a mass several times greater as compared with the diaphragm and/or that the second counterelement have a mass several times greater as compared with the diaphragm. This makes possible, with simple means, a further improvement in the acoustic properties of the micromechanical structure.

It is also possible for the micromechanical structure to be provided in monolithically integrated fashion together with an electronic circuit. This makes it possible, using a so-called one-chip solution, to group together the entire unit made up of a micromechanical structure for converting between an acoustic signal and an electrical signal, and an electronic circuit for evaluating and preparing the electronic signals.

It is further preferred that the first and/or second counterelement be provided in a manner produced essentially from semiconductor material, and that the diaphragm encompass semiconductor material, and that the first counterelement have a first electrode, the second counterelement have a second electrode, and the diaphragm have a third electrode. It is thereby advantageously possible for the electrical properties of the micromechanical structure to be optimized to the extent that differential evaluation of the change in capacitance between the electrodes is enabled.

A further subject of the present invention is a method for producing a micromechanical structure according to the present invention, such that for production of the second cavity, a first sacrificial layer either is applied in patterned fashion onto a raw substrate or is introduced in patterned fashion into the raw substrate, and a first precursor structure is obtained; that then, for production of the diaphragm, at least one first diaphragm layer is applied onto the first precursor structure; that then, for production of the first cavity, a second sacrificial layer is applied; and that then, for production of the first counterelement, an epitaxic layer is applied, the first and second openings then being introduced into the counterelements and the first and the second sacrificial layer being removed in order to constitute the first and the second cavity. This makes it possible, in particularly advantageous fashion, to produce the micromechanical structure according to the present invention by way of a relatively robust and comparatively inexpensive production process.

It is also possible for an electronic circuit to be produced, after production of the micromechanical structure, in monolithically integrated fashion with the micromechanical structure, the electronic circuit being disposed either on the first side or on the second side. Monolithic integration of the electronic circuit enables a complete sensor unit or a complete microphone unit to be implemented integrally.

BRIEF DESCRIPTION OF THE VARIOUS VIEWS OF THE DRAWING

Figure 2:
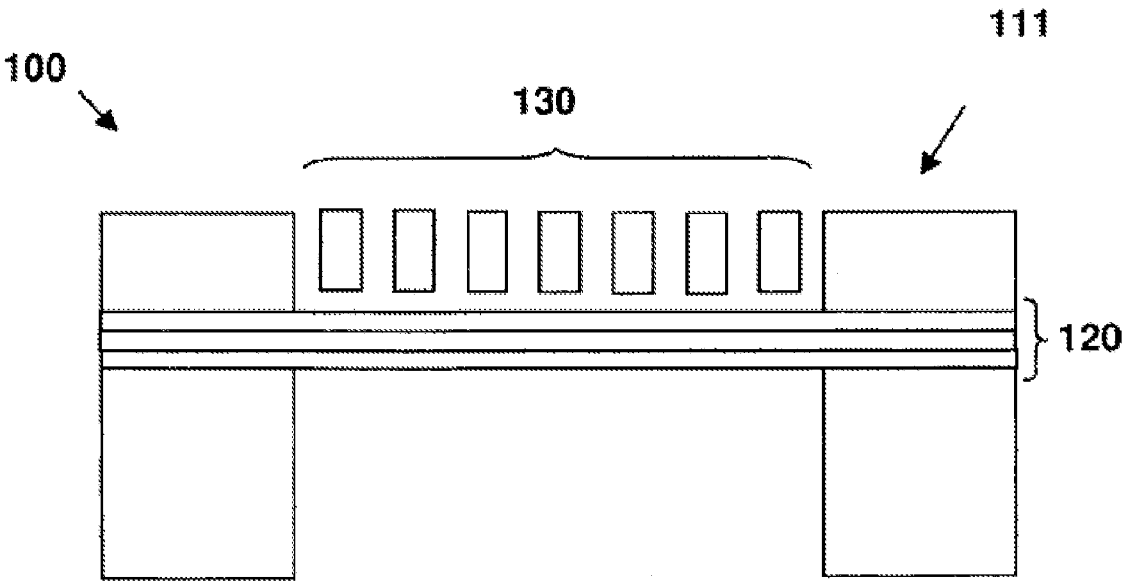
Figure 2 PRIOR ART

FIGS. 1 and 2 schematically depict micromechanical structures known from the existing art.

Figure 3:
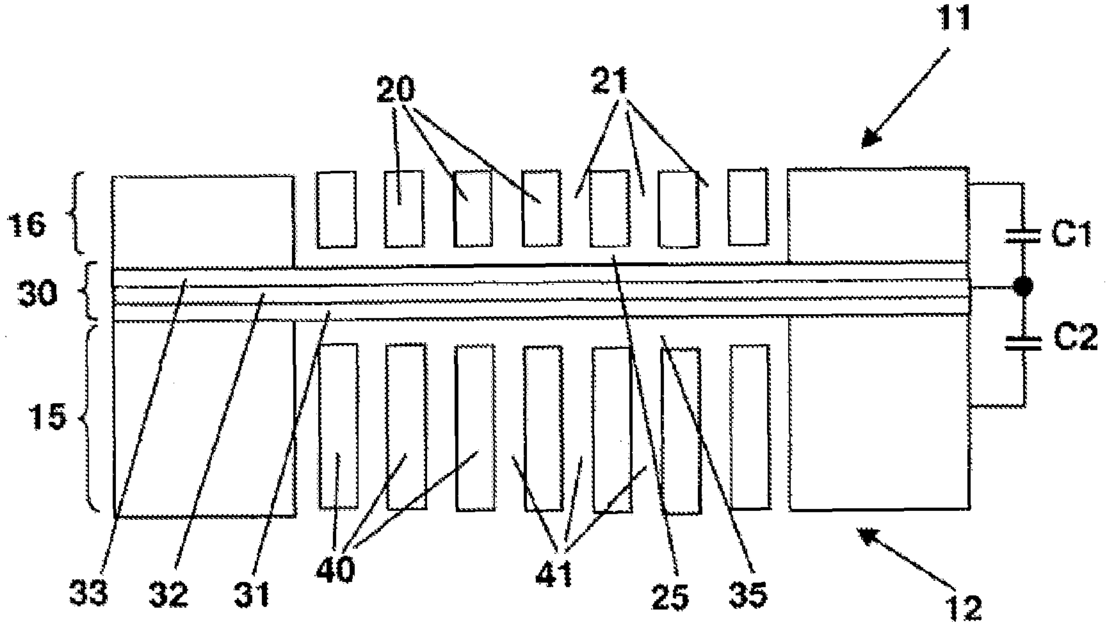

FIG. 3 schematically depicts a micromechanical structure according to the present invention.

Figure 4:
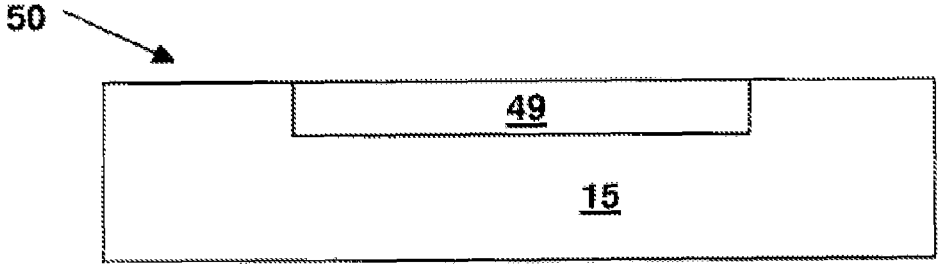
Figure 5:
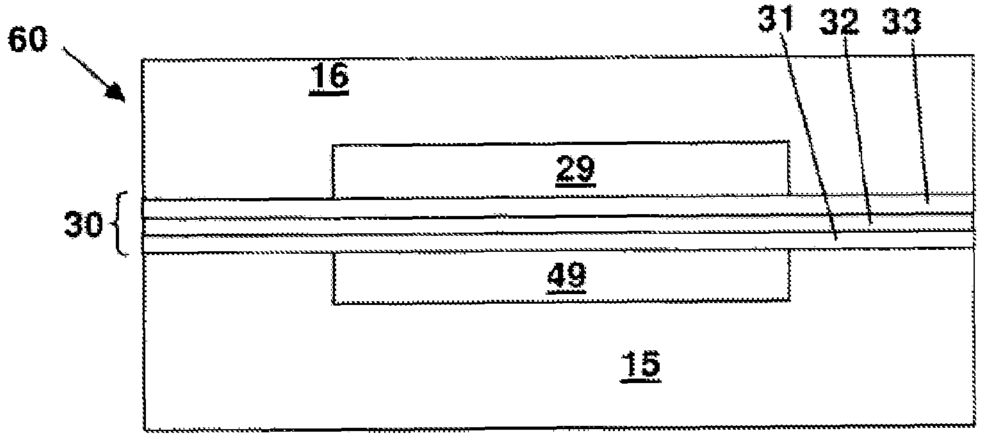

FIGS. 4 and 5 show precursor structures of the micromechanical structure according to the present invention.

DETAILED DESCRIPTION OF THE INVENTION

FIGS. 1 and 2 depict two micromechanical structures 100 known according to the existing art, which each have a diaphragm 120 and a grid-shaped counterelectrode 130. In one case, diaphragm 120 constitutes the surface of the micromechanical structure on a first side 111 (FIG. 1), and in the other case diaphragm 120 is provided in buried fashion, i.e. counterelectrode 130 of micromechanical structure 100 constitutes the surface of micromechanical structure 100 on first side 111 (FIG. 2).

FIG. 3 depicts a micromechanical structure 10 according to the present invention. FIG. 4 depicts a first precursor structure 50, and FIG. 5 a second precursor structure 60. FIGS. 3 to 5 are hereinafter described together. Micromechanical structure 10 according to the present invention has a first counterelement 20, a diaphragm 30, and a second counterelement 40. First counterelement 20 has first openings 21, and second counterelement 40 has second openings 41. According to the present invention, first and second openings 21, 41 are implemented in particular by the fact that first and second counterelement 20, 40 have a grid-like structure. First counterelement 20 constitutes, according to the present invention, a first side 11 of micromechanical structure 10, and second counterelement 40 constitutes, according to the present invention, a second side 12 of micromechanical structure 10.

Micromechanical structure 10 according to the present invention is particularly suitable for being used as a microphone or loudspeaker, and for this application in particular combines high sensitivity to material vibrations of the medium surrounding micromechanical structure 10 with great robustness especially with respect to mechanical influences, since the (comparatively sensitive) diaphragm 30 is disposed in buried and generally protected fashion in the interior of micromechanical structure 10 between the two counterelements 20, 40. Provision is thus made according to the present invention, in particular, that diaphragm 30, which is comparatively thin compared with the thickness of both the first and the second counterelement 20, 40, is also protected from the back side (second side) 12, so that it is not exposed to direct mechanical contact during wafer handling in the semiconductor production process, the testing process, and the packaging process. In the installed state, the comparatively stiff structures of counterelements 20, 40 enhance the robustness of the micromechanical structure. The construction according to the present invention of micromechanical structure 10 is flip-chip-capable for both a microphone application and a loudspeaker application, since there is comparatively little topography on the surface and the topography thus also combinable with modern low-voltage CMOS methods. The flip-chip connections can be made via metal connector points (not depicted) via first side 11 of structure 10. The first and the second counterelement 20, 40 are hereinafter also respectively referred to as the first and second counterelectrode 20, 40. First and second openings 21, 41 in first and second counterelectrodes 20, 40, respectively, are introduced in order to achieve pressure equalization respectively between the first and the second cavity and the exterior of micromechanical structure 10 according to the present invention. According to the present invention it is also possible for diaphragm 30 to be provided in partly open fashion, or for diaphragm 30 to have an opening (not depicted) for static pressure equalization. As an alternative to an opening in diaphragm 30, it is also possible for an opening for pressure equalization to be present in other regions of the micromechanical structure.

Diaphragm 30 is provided in freely movable fashion, and upon excitation by acoustic signals (waves) of a medium (in particular a gas, and in particular air) surrounding micromechanical structure 10, is caused to move so that diaphragm 30 vibrates. The motion of diaphragm 30 causes the spacing from first counterelement 20, located above diaphragm 30 (i.e. on a first side 11 of micromechanical structure 10) to decrease and increase. This change in spacing can, according to the present invention, be evaluated capacitatively. For this, provision is advantageously made according to the present invention for first counterelement 20 to have a first electrode, diaphragm 30 to have a second electrode 32, and second counterelement 40 to have a third electrode. FIG. 3 also schematically depicts the corresponding capacitor assemblages C1 and C2, which are constituted by the shape of counterelements 20, 40 and of diaphragm 30. A first capacitor C1 is implemented between first counterelement 20 and diaphragm 30, and a second capacitor C2 between diaphragm 30 and second counterelement 40. A small spacing between diaphragm 30 and first counterelement 20 advantageously allows a high electrical sensitivity to be achieved. This makes it possible for diaphragm 30 to be embodied under a controlled tensile stress, and nevertheless permits high sensitivity.

The disposition of counterelements 20, 40 on both sides relative to diaphragm 30 allows micromechanical structure 10 according to the present invention to be used for differential evaluation of the change in capacitance, which enables higher sensitivity. Associated with this is the possibility for coupling in the acoustic oscillation or acoustic signal of the medium surrounding the micromechanical structure both from first side 11 of structure 10 and from second side 12 of structure 10. If diaphragm 30 is contacted as a measurement electrode, it is additionally possible for first counterelement 20 and second counterelement 40 to be connected to ground potential, thereby reducing the electrical sensitivity to contaminants and charges from the environment. In addition to its function as first electrode, first counterelement 20 can also be used in the microphone design for other mechanical or electrical functions (configuring springs and movable diaphragm clamping systems, electrical contacting of individual components, e.g. for electrical adjustment of sensitivity).

In order to illustrate the method according to the present invention for producing micromechanical structure 10, FIG. 4 depicts first precursor structure 50 of micromechanical structure 10. First precursor structure 50 encompasses a raw substrate 15 of micromechanical structure 10, into which substrate a first sacrificial layer 49 is introduced. Raw substrate 15 is, in particular, a doped silicon substrate. First sacrificial layer 49 is, for example, an oxidized region of raw substrate 15, i.e., first sacrificial layer 49 is provided in a manner introduced into raw substrate 15. Alternatively thereto, provision can also be made that first sacrificial layer 49 is applied in patterned fashion onto the raw substrate 15, for example has been deposited.

FIG. 5 depicts a second precursor structure 60, at least one first diaphragm layer 31 being provided, in the diaphragm region above first sacrificial layer 49 and outside the diaphragm above raw substrate 15, in a manner applied onto first precursor structure 50. According to the present invention, provision is made in particular for a plurality of, for example, three (or even a number greater or less than three) diaphragm layers to be applied. FIG. 5 depicts, in addition to first diaphragm layer 31, a second diaphragm layer 32 and a third diaphragm layer 33. Diaphragm layers 31, 32, 33 together constitute diaphragm 30. According to the present invention, a second sacrificial layer 29 is applied above diaphragm 30. An epitaxic layer 16 is then applied in order to constitute the second precursor structure 60.

In order to constitute micromechanical structure 10 according to the present invention, first openings 21 are then introduced from first side 11 into epitaxic layer 16, in particular using an anisotropic trench etching process. Second sacrificial layer 29 is then etched, likewise from first side 11, thereby creating first cavity 25. Subsequent thereto, second openings 41 are introduced from second side 12 into raw substrate 15, in particular using an anisotropic trench etching process. First sacrificial layer 49 is then etched, likewise from second side 12, thereby creating second cavity 35. One skilled in the art will recognize that the treatment of second side 12 can also be performed before the treatment of first side 11.

In order to constitute the first electrode, either epitaxic layer 16 is provided in in-situ-doped fashion, or else a doping region is introduced into epitaxic layer 16. In order to constitute the third electrode, second counterelement 40 or raw substrate 15 is provided in doped fashion, or else a doping region is introduced into second counterelement 40. In the example depicted, second diaphragm layer 32 is provided inside diaphragm 30 as a correspondingly conductive layer, in particular of polycrystalline silicon, having a corresponding doping.

The layer stack of diaphragm 30, made up of first, second, and third diaphragm layers 31, 32, 33, can be made up, for example, of a sequence of silicon nitride, polysilicon, silicon nitride. A diaphragm construction of five diaphragm layers can be made up, for example, of nitride, oxide, polysilicon, oxide, nitride. A diaphragm construction of four diaphragm layers can be made up, for example, of oxide, polysilicon, nitride, and reoxidized nitride. In constructing the diaphragm, care should preferably be taken that the diaphragm as a whole is placed under tensile stress; this can be achieved, for example, by introducing a tensile-stressed layer into the layer sequence of diaphragm 30, for example by way of a low-pressure chemical vapor deposition (LPCVD) silicon nitride layer. It is preferred to use, in order to bring about the tensile stress in the diaphragm, materials whose mechanical properties are readily adjustable (such as thermal oxide, LPCVD nitride). The polysilicon layer is in all cases doped, and serves as an electrically conductive capacitor plate of second electrode 32. The layer thickness of the polysilicon layer is selected in such a way that the layer stress of the polysilicon has only a small effect on the overall stress.

What is claimed is:

1. A micromechanical structure for at least one of receiving and generating acoustic signals in a medium at least partially surrounding the micromechanical structure, comprising:

a first counterelement having first openings such that the first counterelement has a grid structure, wherein the first counterelement essentially forms a first side of the micromechanical structure;

a second counterelement having second openings such that the first counterelement has a grid structure, wherein the second counterelement essentially forms a second side of the micromechanical structure; and an essentially closed diaphragm disposed between the first counterelement and the second counterelement;

wherein a first cavity is provided between the first counterelement and the diaphragm, and wherein a second cavity is provided between the diaphragm and the second counterelement.

2. The micromechanical structure as recited in claim 1, wherein at least one of: a) the first counterelement has a mass at least two times greater than a mass of the diaphragm; and b) the second counterelement has a mass at least two times greater than the mass of the diaphragm.

3. The micromechanical structure as recited in claim 2, wherein the first counterelement has a first electrode, the second counterelement has a second electrode, and the diaphragm has a third electrode.

4. The micromechanical structure as recited in claim 2, wherein the micromechanical structure is configured as at least one of a microphone and a loudspeaker.

5. The micromechanical structure as recited in claim 1, wherein the first and second counterelements are set to ground potential.

6. The micromechanical structure as recited in claim 1, wherein the diaphragm has a tensile stress.

7. The micromechanical structure as recited in claim 1, wherein the diaphragm includes a plurality of diaphragm layers.

8. The micromechanical structure as recited in claim 7, wherein at least two of the plurality of diaphragm layers are made of different materials.

9. The micromechanical structure as recited in claim 7, wherein:

the plurality of diaphragm layers includes three diaphragm layers; and the three diaphragm layers includes two silicon nitride layers and a polysilicon layer.

10. The micromechanical structure as recited in claim 9, wherein the polysilicon layer is between the two silicon nitride layers.

11. The micromechanical structure as recited in claim 7, wherein:

the plurality of diaphragm layers includes four diaphragm layers; and the four diaphragm layers includes an oxide layer, a polysilicon layer, a nitride layer, and a reoxidized nitride layer.

12. The micromechanical structure as recited in claim 7, wherein the plurality of diaphragm layers includes a low-pressure chemical vapor deposition (LPCVD) silicon nitride layer.

13. The micromechanical structure as recited in claim 7, wherein the plurality of diaphragm layers includes a doped polysilicon layer that serves as an electrically conductive capacitor plate.

14. A micromechanical structure for at least one of receiving and generating acoustic signals in a medium at least partially surrounding the micromechanical structure, comprising:

a first counterelement having first openings, wherein the first counterelement essentially forms a first side of the micromechanical structure;

a second counterelement having second openings, wherein the second counterelement essentially forms a second side of the micromechanical structure; and an essentially closed diaphragm disposed between the first counterelement and the second counterelement;

wherein the diaphragm includes a plurality of diaphragm layers.

15. A method for producing a micromechanical structure having a first counterelement forming a first side, a second counterelement forming a second side, an essentially closed diaphragm disposed between the first counterelement and the second counterelement, a first cavity provided between the first counterelement and the diaphragm, and a second cavity provided between the diaphragm and the second counterelement, the method comprising:

providing a first sacrificial layer by one of applying the first sacrificial layer in patterned fashion onto a substrate or introducing the first sacrificial layer in patterned fashion into the substrate, and obtaining a first precursor structure, wherein the providing of the first sacrificial layer is a part of producing the second cavity;

subsequently applying at least one first diaphragm layer onto the first precursor structure as a part of producing the diaphragm;

subsequently applying a second sacrificial layer as a part of producing the first cavity;

subsequently applying an epitaxial layer;

introducing first openings in the epitaxial layer and removing the first sacrificial layer to form the first cavity, wherein the remaining parts of the epitaxial layer adjacent to the first openings form the first counterelement; and introducing second openings into the substrate and removing the second sacrificial layer to form the second cavity, wherein the remaining parts of the substrate adjacent to the second openings form the second counterelement.

16. The method as recited in claim 15, further comprising:

producing an electronic circuit in monolithically integrated fashion with the micromechanical structure, wherein the electronic circuit is provided on one of the first side or the second side.

17. The method as recited in claim 15, wherein the diaphragm has a tensile stress.

18. The method as recited in claim 15, wherein the diaphragm includes a plurality of diaphragm layers.

19. The method as recited in claim 18, wherein:

the plurality of diaphragm layers includes three diaphragm layers; and the three diaphragm layers includes two silicon nitride layers and a polysilicon layer.

20. The method as recited in claim 18, wherein:

the plurality of diaphragm layers includes four diaphragm layers; and the four diaphragm layers includes an oxide layer, a polysilicon layer, a nitride layer, and a reoxidized nitride layer.

* * * * *